United States Patent [19]

Schindler

[11] Patent Number: 4,502,004

[45] Date of Patent: Feb. 26, 1985

[54] CURRENT PULSE MONITOR

[76] Inventor: John A. Schindler, P.O. Box 703, Metairie, La. 70004

[21] Appl. No.: 430,588

[22] Filed: Dec. 2, 1982

Related U.S. Application Data

[63] Continuation-in-part of Ser. No. 164,231, Jun. 30, 1980.

[51] Int. Cl.³ .................... G01R 19/16; G01R 19/26; G01R 1/22

[52] U.S. Cl. .............................. 324/103 P; 324/102; 324/120; 324/127

[58] Field of Search ............... 324/103 P, 103 R, 102, 324/119, 120, 127, 142, 220, 117 R; 340/664

[56] References Cited

U.S. PATENT DOCUMENTS

| | | | |
|---|---|---|---|
| 3,201,688 | 8/1965 | Ferguson | 324/103 R |
| 3,582,777 | 6/1971 | Wunderman | 324/115 |
| 3,631,342 | 12/1971 | McDonald | 324/120 |
| 4,321,530 | 3/1982 | Kelly et al. | 324/115 |

Primary Examiner—Ernest F. Karlsen
Attorney, Agent, or Firm—Keaty & Keaty

[57] ABSTRACT

An apparatus for measuring varying current levels is particularly suited to the measurement of distinct current pulses. The apparatus couples by means of an inductive sensor to a current carrying conductor. A current pulse in the conductor induces a voltage within the sensor, which is then converted by a unipolar voltage to frequency converter to a sequence of electrical pulses, the total number of which is proportionate to the peak current value of the pulse. The number of pulses produced may be displayed as a measurement of the peak current pulse; in a preferred embodiment, the apparatus compares the number of pulses to a pre-set alarm value, enabling the apparatus to signal any occurrence of current pulses over a desired value.

7 Claims, 8 Drawing Figures

CURRENT PULSE MONITOR

This is a continuation-in-part application of the application Ser. No. 164,231 filed June 30, 1980 for "Current Pulse Monitor" now pending in the U.S. Patent and Trademark Office.

BACKGROUND OF THE INVENTION

Field of the Invention

The present invention relates to testing devices and particularly to the testing of electrical currents used in magnetic non-destructive inspection. Even more particularly, the present invention relates to a method and apparatus for testing of electrical current by placing a toroidal probe around the current carrying member and determining the peak value of a pulse of current flowing therethrough.

In the field of non-destructive testing, there are devices utilized for the testing of materials using a magnetic inspection. As an example, drill pipe and other oil field tubulars are tested by magnetic inspection by methods which are known in the art and are thoroughly described in non-destructive testing literature. In short, magnetic inspection is a method for locating surface and sub-surface defects in ferro-magnetic materials such as for example steel. The material to be inspected is magnetized and defects (in the material being tested) produce magnetic "leakage" fields which fields can be detected by various means and are indicative of defects in the material.

The effectiveness of magnetic inspection is highly dependent upon obtaining the proper degree of magnetization in the object (such as for example a length of drill pipe) to be inspected. The magnetization is commonly obtained by subjecting the material under test to a magnetic field created by an electrical current. The strength of this field is directly proportional to the magnitude of the current. Therefore, by measuring the magnitude of the current the degree of magnetization is known.

in practice, large values of current are required to generate sufficient magnetization (several hundred to several thousand amperes). Generating continuous current of this magnitude would require extremely expensive and cumbersome equipment. Therefore, the art has developed lighter and less expensive equipment which can generate pulses of current of short duration (on the order of one second or less) while achieving the desired magnitude. The residual magnetic field left in the material as a result of the current pulse can be sufficient to perform the magnetic inspection provided that the current pulse is large enough. The strength of the residual field is dependent upon the magnitude of the current pulse. Specifications are known in the art which require minimum peak current values for a given size, shape, weight, composition, etc. for material being tested.

It is important to know the peak value of the current pulse so that one can know what adequate magnetization has occurred.

It is to this problem that the present invention is directed. The present invention provides a method and apparatus which measures the peak value of the current pulse and also contains a programmable alarm and reset feature which facilitates its use in a commercial inspection operation.

Thus, the present invention is not directly involved in the testing process itself of the ferro-magnetic material such as the length of drill pipe, but rather is involved in the testing of the electrical current being used to magnetize the drill pipe or like ferro-magnetic material being tested.

It is an object of the present invention to provide a current pulse monitor having the ability to measure current pulses of high magnitude and short duration.

It is another object of the present invention to provide a current pulse monitor having the ability to measure currents without the need to connect directly to the system to be tested and with essentially zero insertion loss.

Another object of the present invention is to provide a current pulse monitor having the ability to compare measured values automatically to any desired value set by the user.

Another object of the present invention is to provide a current pulse monitor having an alarm system which responds to the attainment of an amperage value over any desired value set by the user.

Another object of the present invention is to provide a current pulse monitor having an automatic reset capability which facilitates the use of the device in a commercial operation.

It is another object of the present invention to provide a current pulse monitor which is easy to use, portable, and easily adaptable to existing testing systems.

BRIEF DESCRIPTION OF THE DRAWINGS

For a further understanding of the nature and objects of the present invention, reference should be had to the following detailed description, taken in conjunction with the accompanying drawings, in which like parts are given like reference numerals and, wherein.

DETAILED DESCRIPTION OF PREFERRED EMBODIMENT

Figure 1:
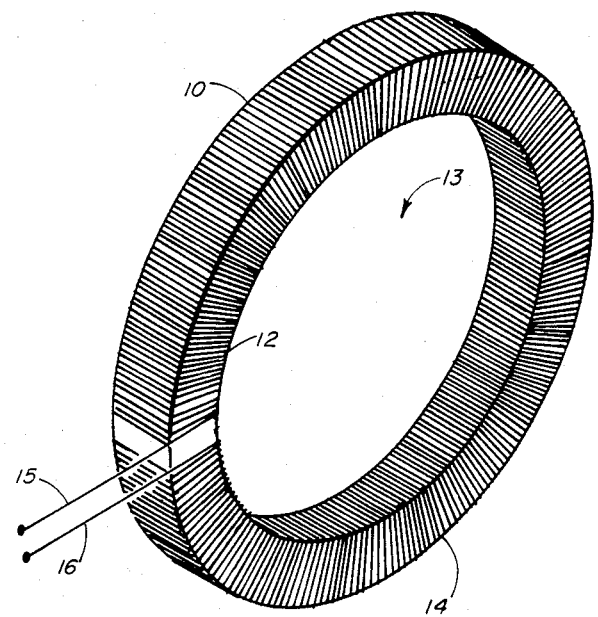
FIG. 1 is a schematic illustration of the sensor portion of the preferred embodiment of the apparatus of the present invention.
Figure 2:
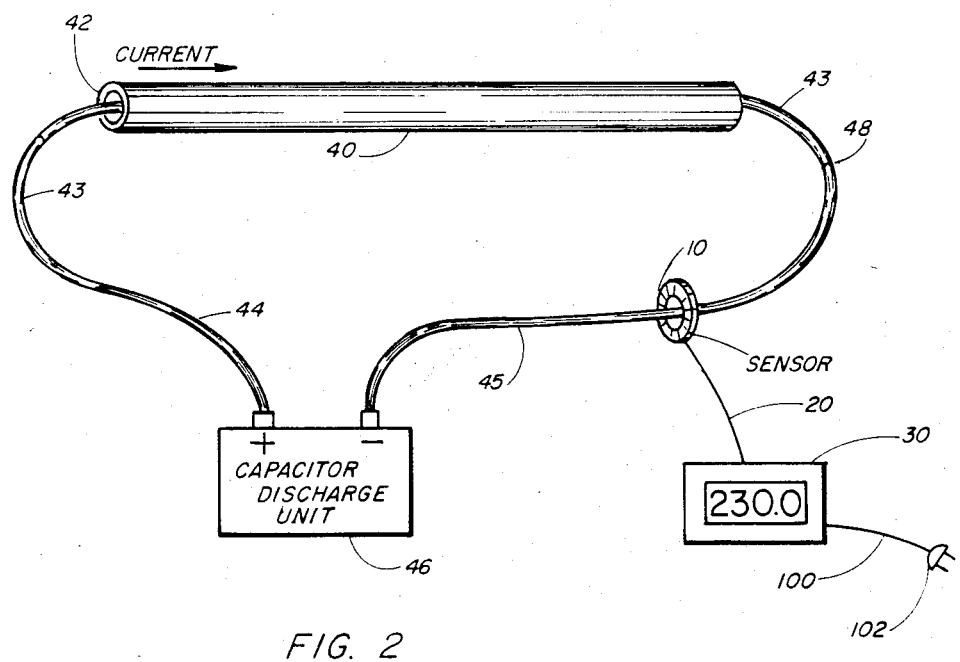
FIG. 2 is a schematic view of a typical magnetic inspection illustrating the use of the preferred embodiment of the apparatus of the present invention therewith.
Figure 3:
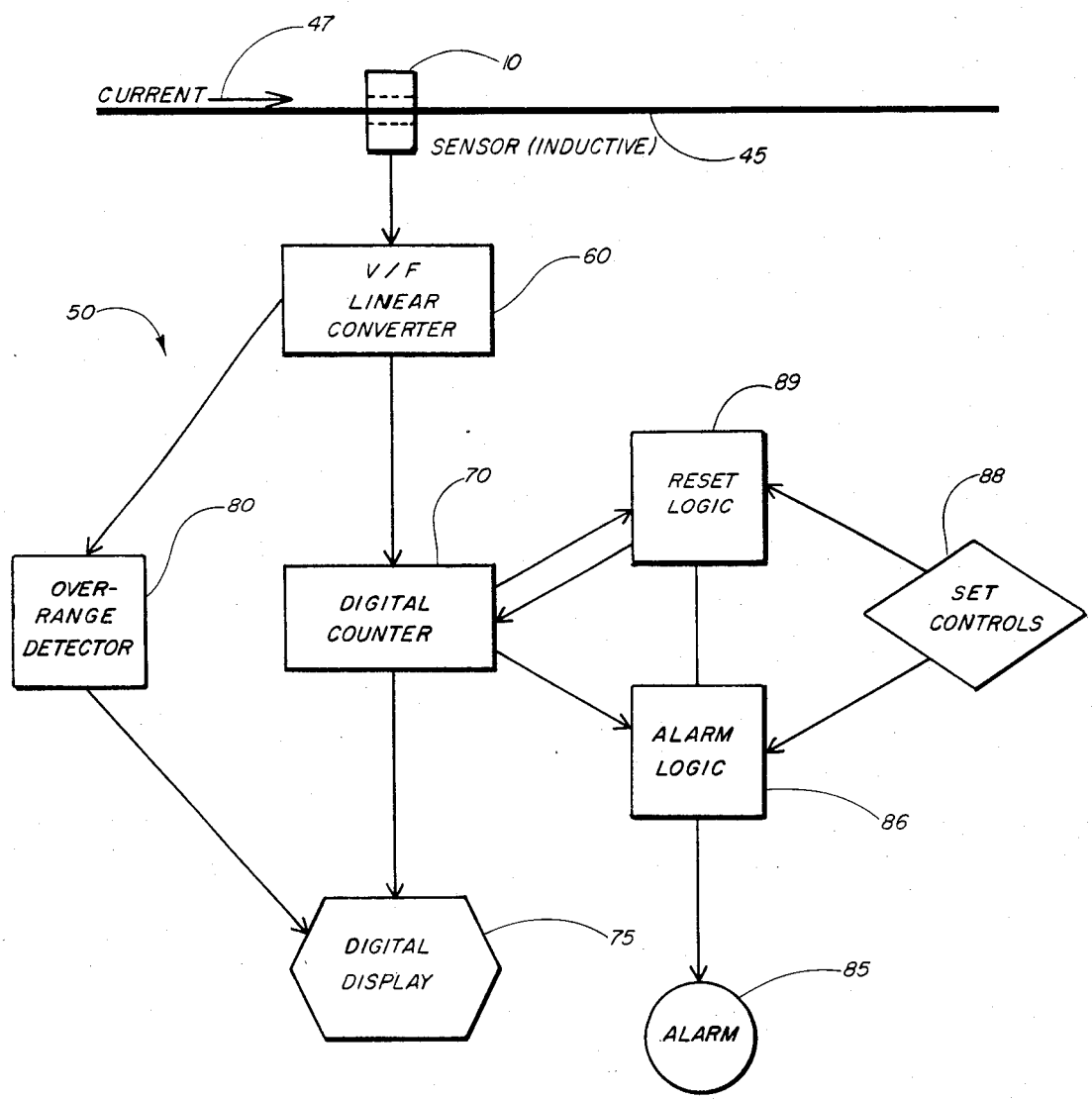
FIG. 3 is a schematic block diagram of the preferred embodiment of the apparatus of the present invention.

FIGS. 1–3 best show the preferred embodiment of the apparatus of the present invention.

In FIG. 1 there can be seen a diagram of the sensor portion of the preferred embodiment of the apparatus of the present invention designated generally by the numeral 10. Sensor 10 is toroidal in shape, of rectangular cross-section, providing a continuous circular core 12 defining an inner opening 13. In the preferred embodiment, opening 13 would be for example three inches in diameter while core 12 would have a cross sectional dimension of for example one and one-half by 0.875 inches.

Core 12 would be wrapped with wire 14 which would be for example 850 turns of number 30 AWG (magnet) wire evenly distributed around core 12. The end portions of wire 14 would provide terminals 15, 16 which could be attached to for example coaxial cable 20 (see FIG. 2). Cable 20 would be attached to monitor 30 which will be described more fully hereinafter.

In FIG. 2 there is seen a typical magnetic inspection of for example a length of drill pipe 40. Drill pipe 40 would provide an inner bore 42 through which is inserted a member 43 which member 43 is attached at its end portions to cables 44, 45 respectively. Capacitor discharge unit 46 attaches at the other end portion respectively of cables 44, 45. It should be understood that such a magnetic inspection is old and known in the art.

A quick disconnect connection 48 would be provided between member 43 and cable 45 and also at the capacitor discharge unit 46. Such a quick disconnect connection would allow toroidal sensor 10 to be inserted over cable 45 with cable 45 passing through the central opening 13 of sensor 10.

A power supply 100 would be plugged into for example a 120 volt outlet using plug 102 in order to activate monitor 30.

In FIG. 3 there is seen a schematic illustration of the current pulse monitor apparatus of the present invention which is designated generally by the numeral 50.

Note the schematic representation of cable 45 in FIG. 3 as well as toroidal sensor 10. The direction of current flowing through cable 45 is represented by the arrow 47 in FIG. 3.

Sensor 10 as aforedescribed provides a continuous coil 14 which is preferably wound about core 12 with the turns of coil 14 being substantially parallel to the direction of current flow (see arrow 47). As aforedescribed, conductor or cable 45 carries the current to be measured which is passed through the center 13 of sensor 10. In this manner when a current flows through conductor 45, a voltage will be output from sensor 10 which is directly proportional to the rate of change of the current. In order to obtain the actual current flowing, this voltage must be mathematically integrated and multiplied by the appropriate scaling factor so that a read out directly in amperes is obtained on the screen portion of monitor 30.

The process of digital integration is carried out by the use of voltage to frequency converter (V/F converter) 60 and digital counter 70.

The voltage to frequency converter is linear, i.e. the output frequency is directly proportional to the input voltage from sensor 10. Digital counter 70 (i.e. summation circuit) totalizes the number of pulses output from the voltage to frequency converter 60 and displays the sum on digital display 75. The number is held on the display 75 indefinitely or until the system is reset 89. The gain of the voltage frequency converter can be trimmed so that the number displayed can be read directly as amperes of current.

Other circuits are provided which extend the device's usefulness. An over range detector 80 senses the input voltage from the inductive sensor 10 and if that voltage is higher than the input range of the voltage frequency converter, an appropriate signal is generated on the digital display 75. This is required because in an overrange situation the voltage frequency converter 60 will not be linear and the integration process will lose accuracy. The display will alert the user to this fact.

Alarm logic 86 compares the measured amperage to the minimum acceptable amperage programmed by the user by means of the set controls 88. An alarm 85 which can be audible for example is activated if the measured value is greater than or equal to the set value. This provides a positive indication to the user that the set amperage has been achieved or exceeded. If the set amperage is not achieved, there is no alarm and the display will hold the inadequate value until it is manually reset. The alarm feature can be disabled by a manual override switch.

After a current pulse is measured, the reset logic 89 allows the digital counter 70 and display 75 to be zeroed for the next measurement. This reset can be accomplished manually or automatically. Manually, a reset button is pushed to clear the counter 70 and display 75. In the automatic mode, two options are available. First, the device will clear itself immediately before the integration process begins. In the second, the reset operation is timed to occur approximately 10 seconds after the pulse is measured. In both of the automatic modes, there is no need for the user to attend to the device unless the minimum amperage is not achieved.

DESIGN OF CIRCUITRY

Figure 4:
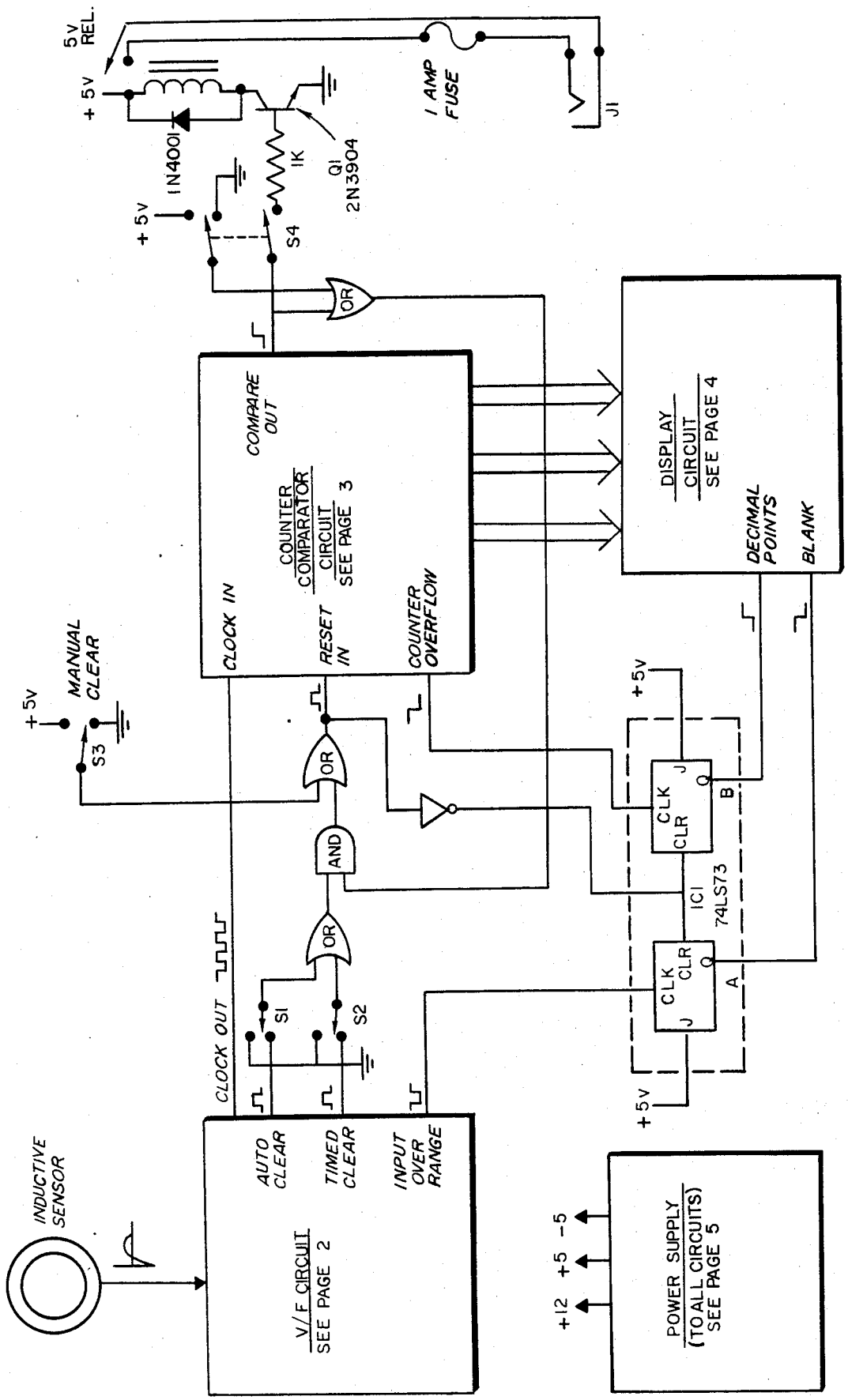
FIG. 4 is a circuit diagram of the preferred embodiment of the apparatus of the present invention.

FIGS. 4–8 in the preferred embodiment of the present invention illustrate in circuit diagram the complete circuitry of the apparatus of the present invention. In FIG. 4, it is pertinent to note that the typical shape of the output voltage which functions as the input to the voltage/frequency circuit is indicated by a small diagram illustrating the starting point of the pulse as a negative going spike which would then rise up through zero (0), go positive and then trail off back to zero (0). The duration of this pulse is typically 0.040 sec. The voltage/frequency portion of the V/F circuit would ignore the negative portion of the input signal (i.e., the V/F circuit is unipolar) and would generate on the positive portion the "Clock Out" signal which would be a pulse train whose frequency is proportional to the input voltage. The negative part of the input voltage would generate the "Auto-Clear" output pulse which would be used to clear or reset the system immediately prior to the integration of the positive portion. The "Timed Clear" pulse generated by a timer would occur typically 10–15 seconds following the initial input pulse and would be used to reset the system in readiness for the next measurement. It should be noted in the preferred embodiment that both the auto-clear and the time clear have switches S-1 and S-2 which would allow those features to be disabled manually. The V/F circuit also has an "Input Over Range" output which would signal that the input voltage is beyond the linear range of the V/F converter. A negative pulse would be generated at that output, going to the "CLK" input of JK flip-flop ICI-A. This will cause the "$\overline{Q}$" output to be set low, resulting in the first three digits of the display to go blank. This would serve as an indicator to the user that when the digits go blank, an erroneous condition has occurred, namely that the input voltage from the sensor is out of range. Resetting the system will restore all digits on the display.

The series of logic gates ("OR", "AND", and "NOT") are standard logic components; they would determine under what conditions the system would be reset. The "Manual Clear" button S3 would always clear the system. The auto-clear or the time-clear would clear the system provided that the minimum current is achieved which is indicated by a high signal from the compare-out of the comparative circuit or the compare feature would be switched off by means of switch S4.

In the case of an error situation, i.e., should the counter (which is a 3-digit counter) attempt to count past 999, an overflow pulse would be generated at "Counter Overflow". Since it is a negative going pulse as indicated on the diagram, that would set flip-flop IC1-B and that flip-flop would in turn cause the decimal points of the display to light up (normally not lit) as an indication of an error condition. Reseting the system will turn-off the decimal points.

The "Compare-Out" signal from the counter-comparator circuit would be used to activate the alarm circuit consisting of a 1K resistor, transistor Q1, a 5-volt relay, a 1 ampere fuse and jack J1. The compare out signal would go positive as indicated when the value measured would be greater than or equal to the valve set into the comparator circuit by the user. When that compare-out signal is high, that would in turn activate transistor Q1 which would turn on the 5-volt relay.

The contacts would close and would cause the jack J1 to act effectively as a switch. Whatever is plugged into jack J1 (for example, an audible alarm system) would turn on. The 1 ampere fuse would protect the switching contacts of the relay from an overcurrent situation and is included as a safety precaution. Switch S4 could be utilized to switch off the alarm feature. Power supply TF would generate a regulated plus 5 and minus 5 volts and an unregulated plus 12 volts. The entire power supply design in the preferred embodiment is a standard design and will be discussed further at FIG. 8.

Figure 5:
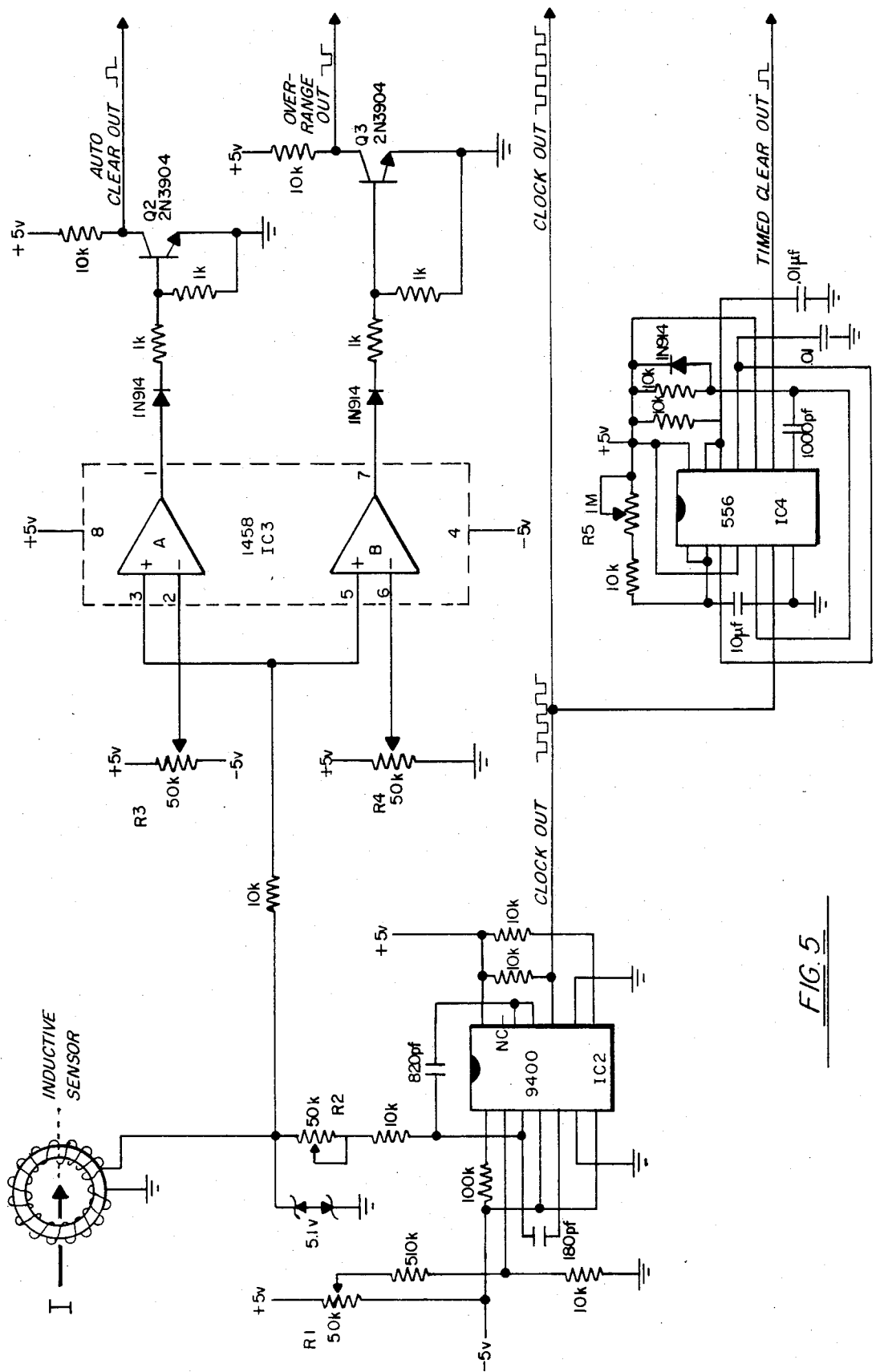
FIG. 5 is a circuit diagram of the voltage to frequency converter circuit portion of the preferred embodiment of the apparatus of the present invention.

FIG. 5 would illustrate a more detailed account of the voltage to frequency converter circuit. It would illustrate inducive sensor IS and the shape of the input voltage from sensor IS. The back-to-back zener diodes would be used as input protection to prevent an over voltage from damaging the circuitry. The voltage to frequency converter CF is an integrated circuit IC2 which is type 9400; the associated components with it form a voltage-to-frequency converter with a gain of 33,700 hertz per volt. The clock output signal, for example, would have a frequency of 33,700 hertz if the input voltage from the sensor IS would be 1 volt. R1, which is 50K potentiometer is used to zero the converter. R2, which is an additional 50K potentiometer, is utilized to set the gain of the voltage-frequency converter FVC. The device is calibrated by adjusting R2 until you get 33,700 hertz for a 1 volt input.

The input signal is also fed over to IC3 which is a dual comparator integrated circuit. This circuit checks the input voltage to see if it exceeds certain limits or conditions which would result in an inaccurate reading. The input voltage is fed through the 10K resistor into the non-inverting input of comparator A. The inverting input is connected to a 50K pot R3 which is nominally set at about zero volts.

In this situation, when the pulse first begins and the input voltage is in the negative region, the comparator A would be switched off. Transistor Q2 would be turned off which in turn would cause a positive pulse of the "Auto-Clear" output. As described earlier, that positive pulse would be used to reset the entire system, and thus accomplishing the automatic clear feature just prior to the integration process which begins on the positive part of the input voltage. Comparator B of IC3 would be also connected to the input voltage and the inverting input would be connected to a 50K pot R4 which is normally set at or around 3 volts, corresponding to the upper limit of the linearity of the V/F converter. Should the input voltage attempt to climb above this, then comparator B would be switched on which would in turn cause Q3 to switch off, and would cause "Overrange Output" to generate a negative going pulse. That overrange output as shown in FIG. 4 as "Input Overrange", would be used to blank the display, indicating that an overrange condition was experienced. (Explained earlier.)

Further in FIG. 5 is shown the "Clock Out" signal from the voltage to frequency converter which is connected to the timer circuit IC4, a 556 dual timer integrated circuit. It would generate a positive pulse shown as "Timed Clear Out" approximately 10 seconds or so after the "Clock Out" signal starts. The purpose of that would be to generate a system reset pulse a given amount of time after the initial measurement of the current begins. The amount of time the system is reset after the measurement of the current is set on R5, a 1 megohm potentiometer. With the values shown in this circuit, one would have an option of varying that reset time anywhere from 1/10 of a second on up to 10 seconds by adjusting R5.

Figure 6:
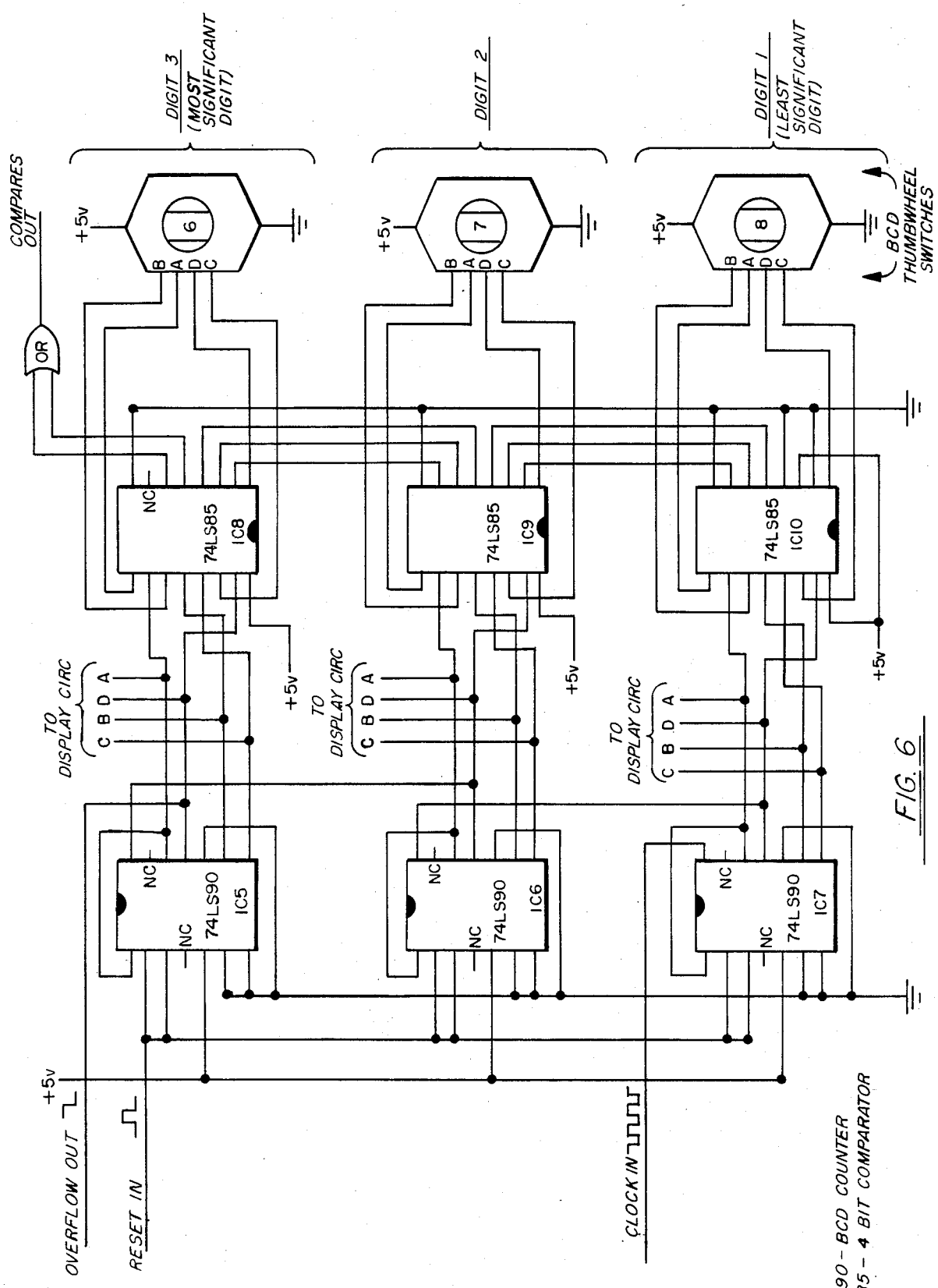
FIG. 6 is a circuit diagram of the counter/comparator circuit portion of the preferred embodiment of the apparatus of the present invention.

FIG. 6 would illustrate the counter-comparator circuit. The part numbers are noted on the drawings. The output pulse train from the voltage to frequency converter shown as "Clock In" is fed into IC7 which is the least significant digit of a 3 digit BCD counter formed by cascading IC7, IC6, and IC5. The "Reset In" up at the top would be a master reset (resets all three of the counters so that the number is cleared back to zero when that reset goes high). The "Overflow Out" signal goes negative when the counter overflows, i.e. attempts to count past "999". This would be an error condition. The "Overflow Out" signal would be used to generate a signal on the display indicating an overflow condition, as explained earlier.

The outputs of the counters would be fed to two locations. They would be fed to the display circuit (see FIG. 7) where they would be displayed on a digital display. They would also be fed to comparators IC8, IC9 and IC10. Like the counters, the comparators would be "cascaded" together and that would allow them to compare two 3-digit numbers (one coming from the counter and the other coming from the three BCD thumbwheel switches). The number set on the BCD thumbwheel switches would be compared to the number in the counters by IC 8-10. The result would come out up at the top of the page through an "OR" gate and is labeled the "Compare-Out" signal. When it would go high, it would indicate that the number measured (which is in the counters) is greater than or equal to the number set on the thumbwheel switches.

The counter is a 3-digit counter but there occurs 4 digits on the display. The digit on the right is a "dummy" digit. It would be hardwired into a "0" (zero) configuration. This has the effect of multiplying the value in the counter by 10. It would also serve as a "pilot light" to indicate that the instrument is on in the event that the other three digits are blanked from an overrange condition. The reason for multiplying by 10 is as follows:

To obtain a readout display which can be read directly as amperes of current, the gain of the V/F converter is required to be 337,000 hertz per volt, for the given sensor previously described. It is simpler, and does not detrimentally affect the accuracy, to use a gain of 33,700 and then multiply by 10.

Figure 7:
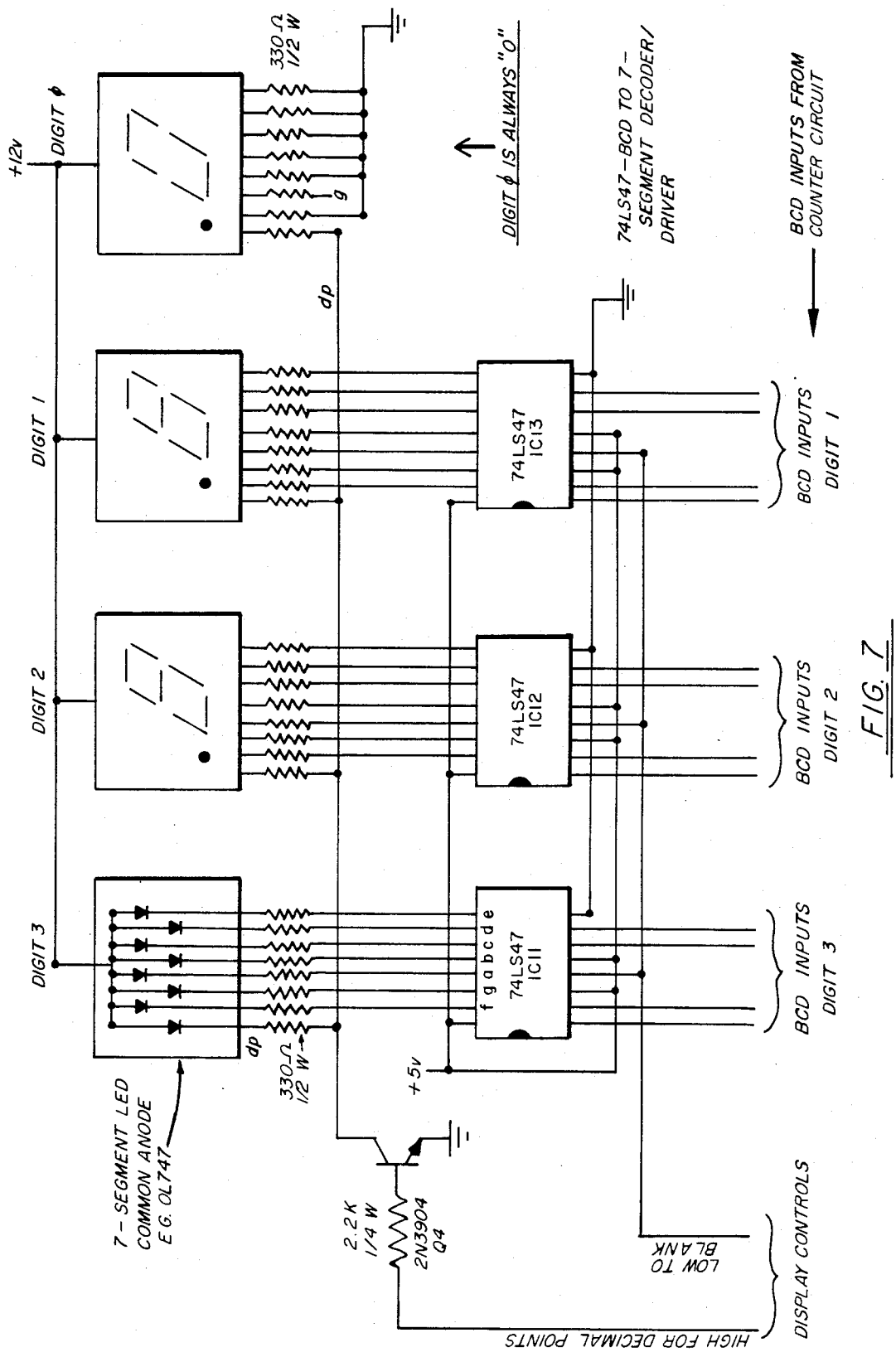
FIG. 7 is a circuit diagram of the digital display circuit portion of the preferred embodiment of the apparatus of the present invention.

The display circuit in FIG. 7 shows four LED numeral-type displays. The "Digit 0" would always be zero. The other three digits would be the counter digits. These LED's are driven by the IC's 11, 12 and 13.

The two error indicators previously described operate as follows:

Refering to "Display Controls" one would see "High for Decimal Points". When that signal would go high, transistor Q4 would be switched on which in turn switches on the decimal points of each of the four displays. When all decimal points light simultaneously, the operator would know that the counter has attempted to count past 999. The second display control is a blanking signal ("Low to Blank") and when that input would go low, the first three digits (digits 3, 2, and 1) would go blank and would serve as an indicator to the user or operator that an input over voltage had been experienced.

Figure 8:
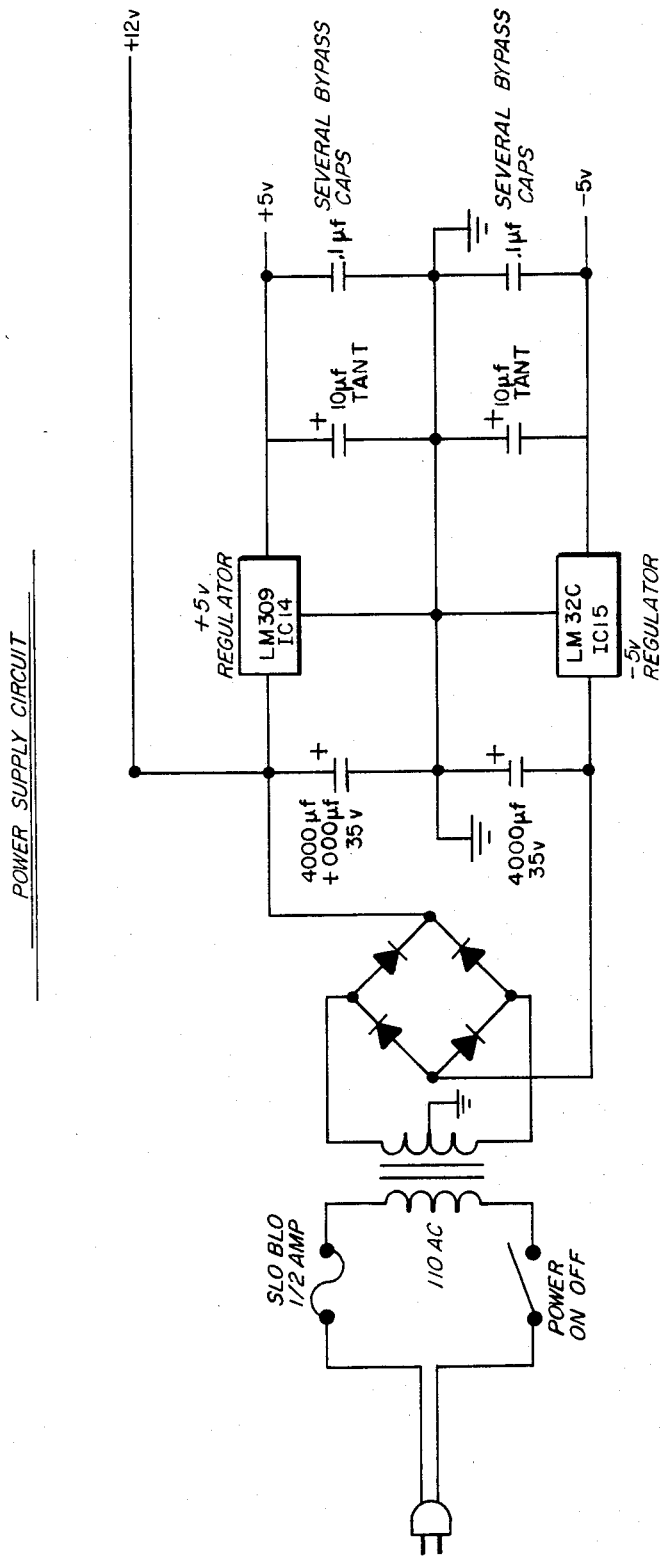
FIG. 8 is a circuit diagram of the power supply circuit portion of the preferred embodiment of the apparatus of the present invention.

FIG. 8 provides a preferable power supply circuit which would be suitable. A provided 12 volt source is unregulated, but the plus 5 and minus 5 volts uses standard commercially available plus 5, minus 5 regulators. Notice that there are several bypass capacitors. Only one is illustrated in the drawing, buth there may be many and they are distributed throughout the device. The apparatus also requires 110 volts of alternating current power to operate. The plus 5 and minus 5 volts and the 12 volts are distributed throughout the circuitry of the device. Essentially the plus 12 volts are used to drive the display. The plus 5 and minus 5 volts run the voltage frequency converter and the other integrated circuits.

Because many varying and different embodiments may be made within the scope of the inventive concept herein taught, and because many modifications may be made in the embodiments herein detailed in accordance with the descriptive requirement of the law, it is to be understood that the details herein are to be interpreted as illustrative and not in a limiting sense.

What is claimed as invention is:

1. An apparatus for monitoring current pulse within a conductor comprising:
   a. a sensor member, inductively coupled to said conductor, having a first, positive and a second negative electrical lead;
   b. means, electrically connected to said first and second leads, responsive to the passage of a single, non-sinusoidial current signal coupled to said sensor member for determining the instantaneous peak value of said pulse signal, further comprising;
   c. a unipolar voltage-to-frequency converter means, electrically connected to said leads, adapted for converting a positive voltage pulse induced by said single electrical current signal coupled to said sensor member into a series of electrical pulses, the frequency of said pulses being proportional to the induced voltage;
   e. resetting means, electrically connected to said leads, adapted for converting a negative voltage pulse induced by said single electrical current signal coupled to said sensor member into a single reset pulse; and
   f. digital counter means connected to said converter means and said resetting means, adapted for counting the total number of the electrical pulses generated by said converter means, between successive reset pulses.

2. The current pulse monitor of claim 1, wherein said sensor member further comprises:
   a. a toroidal member defining a central bore; and
   b. a wire, spirally wound around said member, defining a first positive and second lead at the wire ends thereof.

3. An apparatus as described in claim 1, further comprising:
   a. overrange detector means for generating a signal responsive to the voltage induced by said electrical current coupled to said sensor member when the voltage exceed the input range of said voltage-to-frequency converter means; and
   b. presetting means for identifying a desired maximum amperage value for the electrical current coupled to said sensor member coupled to said counter means for generating a signal responsive to an occurance that the peak value of said electrical current exceeds the maximum value identified by said presetting means.

4. A method of monitoring a current pulse comprising the following steps:
   a. providing sensor member inductively coupled to said current pulse;
   b. Inducing thereby a voltage pulse in said sensor member, oriented with the initial voltage excursion of said pulse being negative;
   c. detecting said negative voltage excursion to define a zero start time;
   d. generating a pulse train having an instantaneous frequency proportional to the instantaneous positive voltage of said voltage pulse;
   e. counting the total number of pulses generated in said pulse train from said start time zero to the end of said induced voltage pulse; and
   f. displaying said total number as a measure of the peak current valve of said pulse.

5. The method of claim 4, further comprising the step of generating a signal responsive to occurrence of a voltage value higher than an input range of a means for the step of generating a pulse train.

6. The method of claim 4, further comprising the step of calibrating a value for a current pulse with the use of a presetting means.

7. The method of claim 4 wherein the step of displaying further comprises the emitting of an alarm when said total number exceeds a preestablished value.

* * * * *